US012651731B2

(12) United States Patent
Kashyap et al.

(10) Patent No.: US 12,651,731 B2
(45) Date of Patent: Jun. 9, 2026

(54) CROSS FLOW GAS DELIVERY FOR PARTICLE REDUCTION

(71) Applicant: Applied Materials, Inc., Santa Clara, CA (US)

(72) Inventors: Dhritiman Subha Kashyap, Bangalore (IN); Sanjeev Baluja, Campbell, CA (US); Chaowei Wang, San Diego, CA (US); Amar Nath Nishad, Bangalore (IN); Robert B. Moore, Bigfork, MT (US)

(73) Assignee: Applied Materials, Inc., Santa Clara, CA (US)

( * ) Notice: Subject to any disclaimer, the term of this patent is extended or adjusted under 35 U.S.C. 154(b) by 358 days.

(21) Appl. No.: 18/532,669

(22) Filed: Dec. 7, 2023

(65) Prior Publication Data

US 2025/0191897 A1     Jun. 12, 2025

(51) Int. Cl.
*H01J 37/32* (2006.01)

(52) U.S. Cl.
CPC .. *H01J 37/32871* (2013.01); *H01J 37/32834* (2013.01); *H01J 2237/334* (2013.01)

(58) Field of Classification Search
CPC ........... H01J 37/32871; H01J 37/32834; H01J 2237/334; H01J 37/3244; H01J 37/32449; C23C 16/45561
USPC ........................ 118/715; 156/345.33, 345.34
See application file for complete search history.

(56) References Cited

U.S. PATENT DOCUMENTS

| | | | |
|---|---|---|---|
| 7,740,705 B2 | 6/2010 | Li | |
| 9,394,615 B2 * | 7/2016 | Sun | ........................ B05D 3/002 |
| 10,364,505 B2 | 7/2019 | Thorkelsson et al. | |
| 10,622,189 B2 * | 4/2020 | Bravo | ............... C23C 16/45565 |
| 10,781,527 B2 | 9/2020 | Banik, II et al. | |
| 10,934,619 B2 * | 3/2021 | Kim | .................. C23C 16/45538 |
| 11,001,925 B2 * | 5/2021 | Kim | .................. C23C 16/45527 |
| 2014/0103145 A1 * | 4/2014 | White | ............... C23C 16/45565 |
| | | | 239/548 |

FOREIGN PATENT DOCUMENTS

| | | |
|---|---|---|
| CN | 103915306 A | 7/2014 |
| WO | 2012061593 A2 | 5/2012 |
| WO | 2014179093 A1 | 11/2014 |
| WO | 2017173097 A1 | 10/2017 |
| WO | 2020243288 A1 | 12/2020 |

OTHER PUBLICATIONS

"PCT International Search Report and Written Opinion in PCT/ US2024/058345 dated Apr. 2, 2025, 10 pages".

* cited by examiner

*Primary Examiner* — Rudy Zervigon

(74) *Attorney, Agent, or Firm* — SERVILLA WHITNEY LLC

(57) ABSTRACT

Gas distribution apparatus comprising a backing plate and faceplate, and methods of use are described. The backing plate has a peripheral channel with a plurality of inwardly angled inlet channels extending from the peripheral channel to the front surface of the backing plate. The plurality of inwardly angled inlet channels are located in an inlet semicircle of the backing plate and spaced to form an inlet zone comprising a minor arc of a semicircle less than 160°. An outlet opening in an outlet semicircle in the range of 30° to 90° is centered opposite the center of the minor arc of the inlet semicircle.

20 Claims, 5 Drawing Sheets

CROSS FLOW GAS DELIVERY FOR PARTICLE REDUCTION

TECHNICAL FIELD

Embodiments of the disclosure generally relate to gas delivery systems for processing chambers for semiconductor manufacturing. In particular, embodiments of the disclosure relate cross-flow gas delivery systems for semiconductor manufacturing processing chambers.

BACKGROUND

During semiconductor device manufacturing, numerous materials are formed on and removed from a substrate to form the underlying devices. Great efforts are generally expended to produce highly uniform material layers and device features. However, distributions in material layer thickness, critical dimension (CD), and the like nonetheless exist across a substrate. As semiconductor device dimensions shrink, such variations in thickness uniformity, CD uniformity, etc., become more difficult to tolerate.

Many deposition and etching processes in semiconductor manufacturing use a microwave plasma source to generate a plasma within a processing region of a processing chamber. The current microwave showerhead designs have resonators for the microwave and flow through holes in their facility and faceplate. O-rings are placed between the facility and faceplate to isolate the flow path and maintain vacuum. The O-rings are a source of particles observed on wafers during plasma operation. The particles can result in device failures decreasing the overall yield from any given wafer.

Therefore, there is a need in the art for apparatus and methods that reduce particles during plasma processing.

SUMMARY

Some embodiments of the disclosure are directed to a gas distribution apparatus including: a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone including a minor arc of the inlet semicircle less than 160°, the backing plate having an outlet opening on an outlet semicircle of the backing plate, the outlet opening in the range of 30° to 90° and centered opposite a center of the minor arc of the inlet semicircle; and a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate.

Additional embodiments of the disclosure are directed to gas distribution apparatus including: a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone including a minor arc of the inlet semicircle less than 160°, the backing plate having an outlet opening on an outlet semicircle of the backing plate, the outlet opening in the range of 30° to 90° and centered opposite a center of the minor arc of the inlet semicircle; a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate; and a clamping ring having an upper portion and a lower portion, the upper portion having an outer diameter greater than an outer diameter of the lower portion, the upper portion having an inner diameter sized to enclose the faceplate, the lower portion having an upper support surface configured to support the faceplate, the lower portion having an inwardly directed extension having a back surface spaced from the upper support surface, the lower portion having a plurality of spaced apertures between the back surface of the inwardly directed extension and the upper support surface.

Further embodiments of the disclosure are directed to gas distribution apparatus including: a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone including a minor arc of the inlet semicircle less than 160°, the backing plate having an outlet opening on an outlet semicircle of the backing plate, the outlet opening in the range of 30° to 90° and centered opposite a center of the minor arc of the inlet semicircle; a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate; a clamping ring having an upper portion and a lower portion, the upper portion having an outer diameter greater than an outer diameter of the lower portion, the upper portion having an inner diameter sized to enclose the faceplate, the lower portion having an upper support surface configured to support the faceplate, the lower portion having an inwardly directed extension having a back surface spaced from the upper support surface, the lower portion having a plurality of spaced apertures between the back surface of the inwardly directed extension and the upper support surface; and a pumping ring in contact with the back surface of the backing plate, the pumping ring having an exhaust opening aligned with the exhaust opening of the backing plate, wherein the backing plate further includes an exhaust opening extending through the thickness of the backing plate outside an outer diameter of the peripheral channel and outside an outer diameter of the faceplate, wherein the upper portion of the clamping ring further includes an exhaust aperture extending from the back surface of the upper portion to a front surface of the upper portion, the exhaust aperture of the clamping ring aligned with the exhaust opening of the backing plate, wherein the inwardly angled inlet channels have outlet openings in the front surface of the backing plate, the outlet openings located equidistant from each other, wherein there are at least five inwardly angled inlet channels, wherein the peripheral channel has a depth in the range of 5 mm to 15 mm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. Additionally, it should be noted that the shading applied to the Figures is intended to aid in differentiation of the components and is not related to the materials of constructions.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
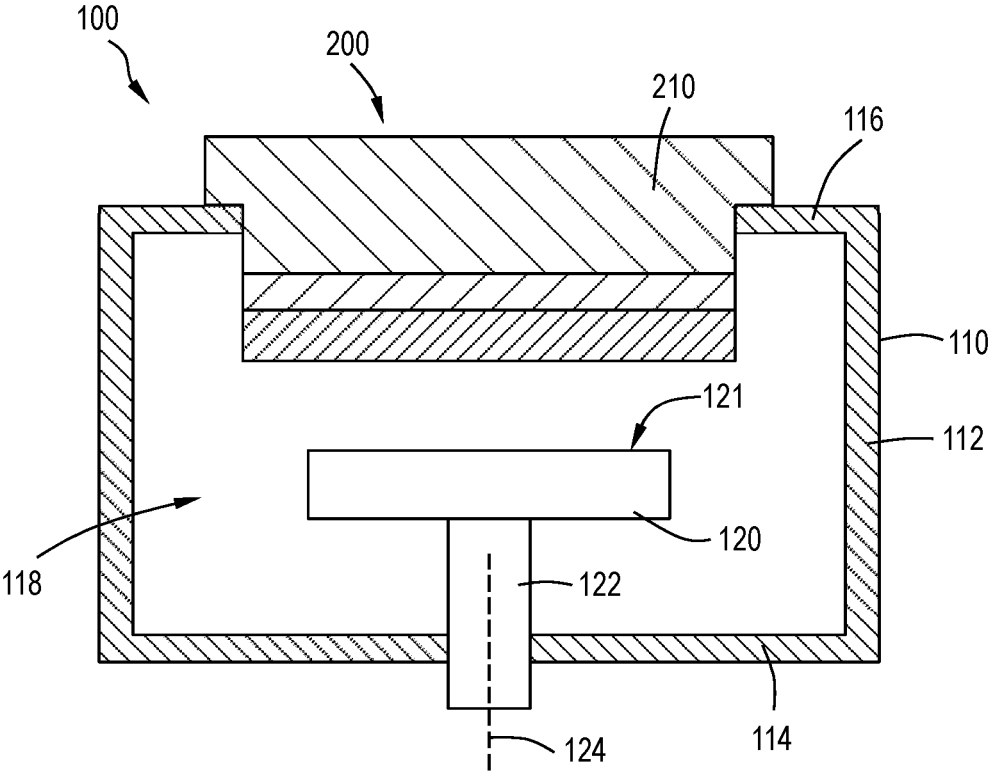
FIG. 1 illustrates a cross-sectional schematic view of a generic plasma processing chamber with a gas distribution apparatus according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure provide a new microwave showerhead design with crossflow delivery of gases into a processing chamber. Some embodiments provide gas delivery systems with improved inflow and pumping that enables crossflow within the limits of the current hardware. Some embodiments provide gas delivery systems that can separate plasma and flow paths to avoid particle generation in O-rings and other flow components.

Some embodiments of the disclosure provide microwave showerheads that improve the size and distribution of inlet ports which minimizes dead zones/flow recirculation. Some embodiments provide gas distribution systems with faster cycle times for dose and purge compared to current designs. Some embodiments allow for the separation of the gas flow and plasma paths, with no O-ring or other potential particle generating elements present along the flow path. Some embodiments of the disclosure enable the complete separation of plasma and flow paths.

Some embodiments of the disclosure provide gas delivery systems with a five inlet port design set at 30° apart for maximum wafer sweep without flow recirculation. Some embodiments of the disclosure provide gas delivery systems with 300° capping of a pumping liner with 60° openings towards an outlet to enable flow across wafers. Some embodiments of the disclosure provide effective separation of flow and plasma paths, no particle generation components along plasma path, high sweep area on wafer, and a crossflow with microwave station level changes only.

Some embodiments of the disclosure provide a new showerhead which eliminates flow through the faceplate and consequent need for O-rings along the corresponding path. Instead, flow is directed to an edge down through a clamp ring. Multiple inlet ports (e.g., five inlet ports) are positioned at an angle through a facility plate and then vertically and horizontally through the clamp ring. Some embodiments comprise a pumping ring with no hole or plenum at an arc of 270°-300° from around an inlet. A final 60°-90° degree opening below the pump port allows gases to flow across the wafer and reach an outlet.

FIG. 1 illustrates a cross-sectional schematic view of a generic plasma processing chamber 100. The processing chamber 100 has a chamber body 110 with sidewalls 112, a bottom wall 114 and a top wall 116 enclosing an interior 118 of the generic plasma processing chamber 100. A substrate support 120 is located within the interior 118 of the chamber body 110. The substrate support 120 has a support surface 121 that is configured to support a wafer (not shown) during processing. The substrate support 120 illustrated is positioned on a support shaft 122. The support shaft 122 of some embodiments is configured to move the substrate support 120 closer to and further from the bottom wall 114 or top wall 116 of the chamber body 110. In some embodiments, the support shaft 122 is configured to rotate the substrate support 120 around a central axis 124 of the support shaft 122 using one or more motors or actuators (not shown). The substrate support 120 of some embodiments includes one or more of a temperature control element (not shown), for example, a heating element or cooling element or channels. In some embodiments, the substrate support 120 includes an electrostatic chuck (not shown) configured to hold a wafer in place during processing. In some embodiments, the substrate support 120 includes one or more electrical connections (e.g., a power supply and optional match circuit) that allow an electrical bias to be applied to the substrate support 120 using one or more of RF or DC power. The skilled artisan will be familiar with the design of a plasma processing chamber and will understand the component necessary to perform the various functions described as well as other functions, e.g., purging and exhausting the interior 118 of the chamber body 110.

The generic plasma processing chamber 100 illustrated includes a gas distribution apparatus 200. In the illustrated embodiment, the gas distribution apparatus 200 is positioned on the top wall 116 of the chamber body 110 with a portion of the gas distribution apparatus 200 extending through an opening in the top wall 116. The gas distribution apparatus 200 illustrated is a modular system that can be removed from the top wall 116 and replaced or serviced.

Figure 2:
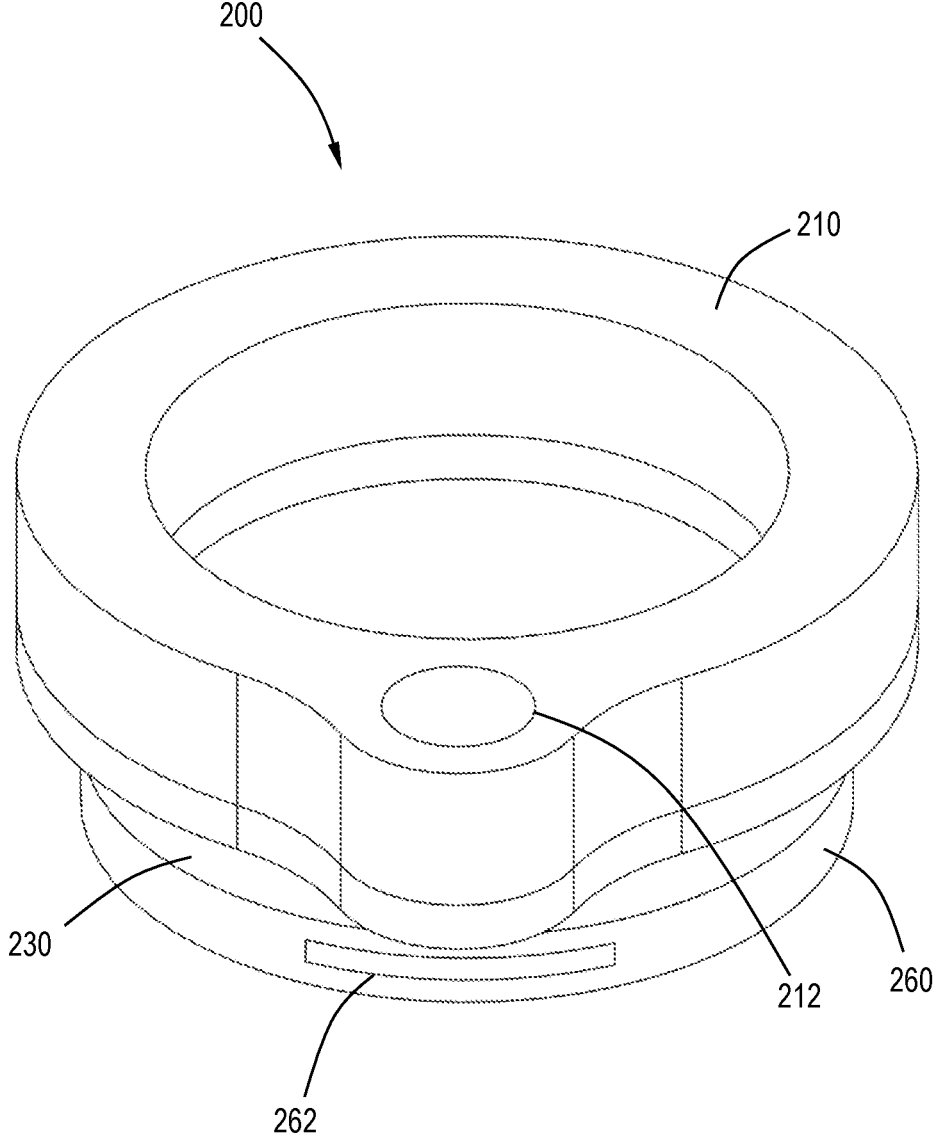
FIG. 2 shows an isometric view of the gas distribution apparatus showing the pumping ring with an exhaust opening according to one or more embodiments of the disclosure.

In the schematic view of FIG. 1, the gas distribution apparatus 200 includes a pumping ring 210 that supports the gas distribution apparatus 200 on the top wall 116 of the chamber body 110, a backing plate 230 and a clamping ring 260. A faceplate 270 is located between the clamping ring 260 and the backing plate 230 as described further below. FIG. 2 shows an isometric view of the gas distribution apparatus 200 showing the pumping ring 210 with an exhaust opening 212, the backing plate 230 and the clamping ring 260 with an exhaust opening 262.

Figure 3:
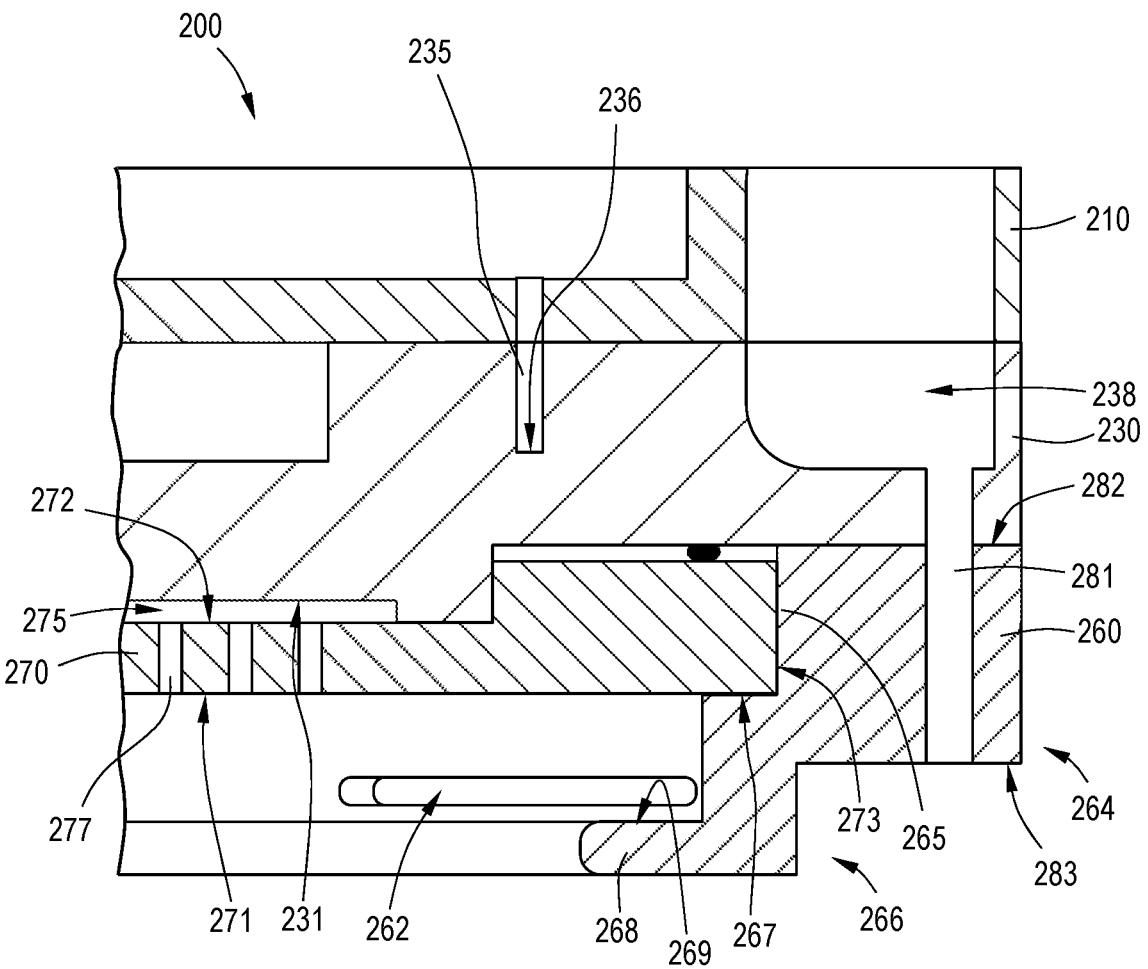
FIG. 3 shows a cross-sectional view of a portion of a gas distribution apparatus according to one or more embodiments of the disclosure.
Figure 4:
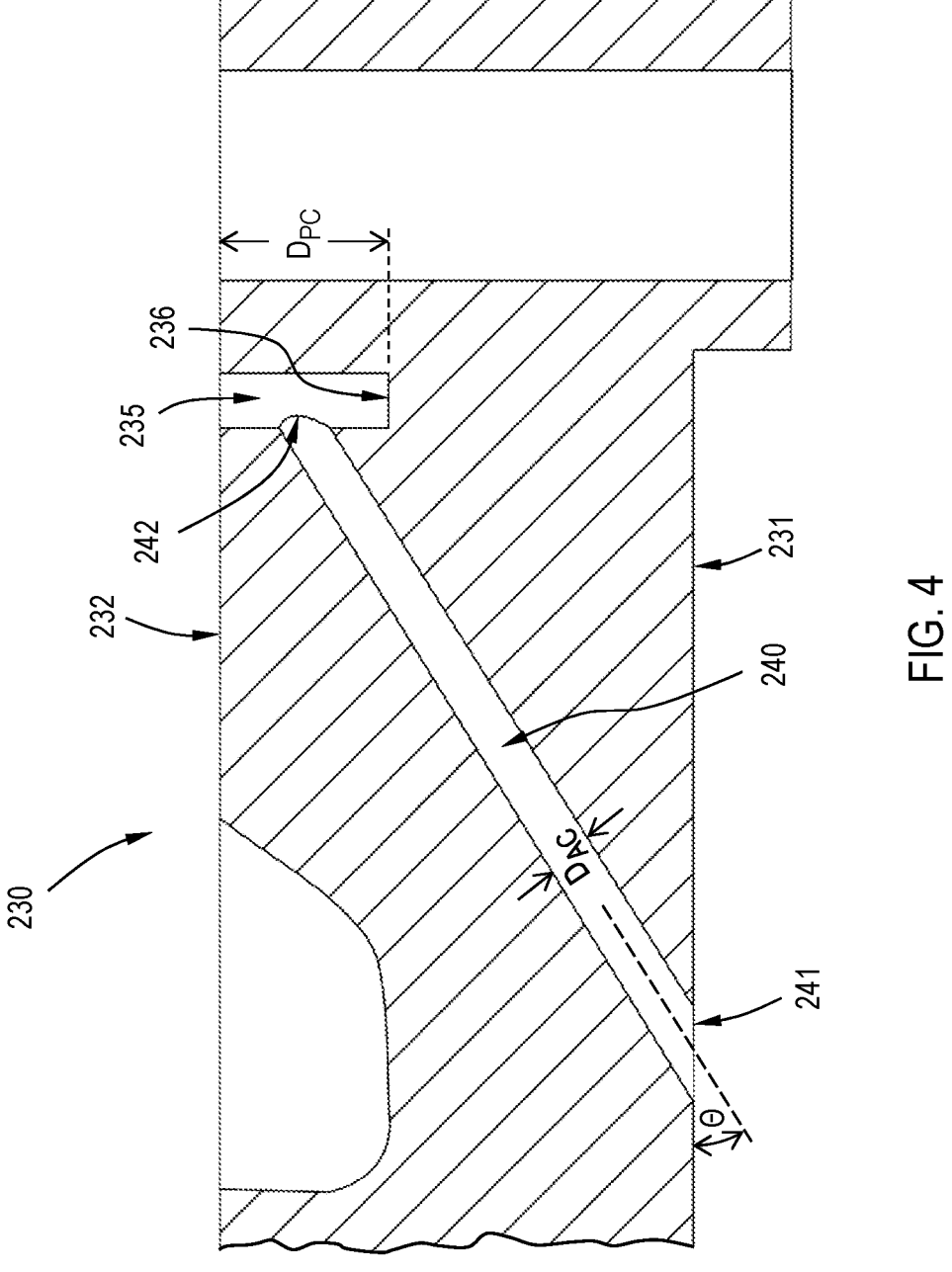
FIG. 4 shows a cross-sectional view of a portion of a backing plate according to one or more embodiments of the disclosure.
Figure 5:
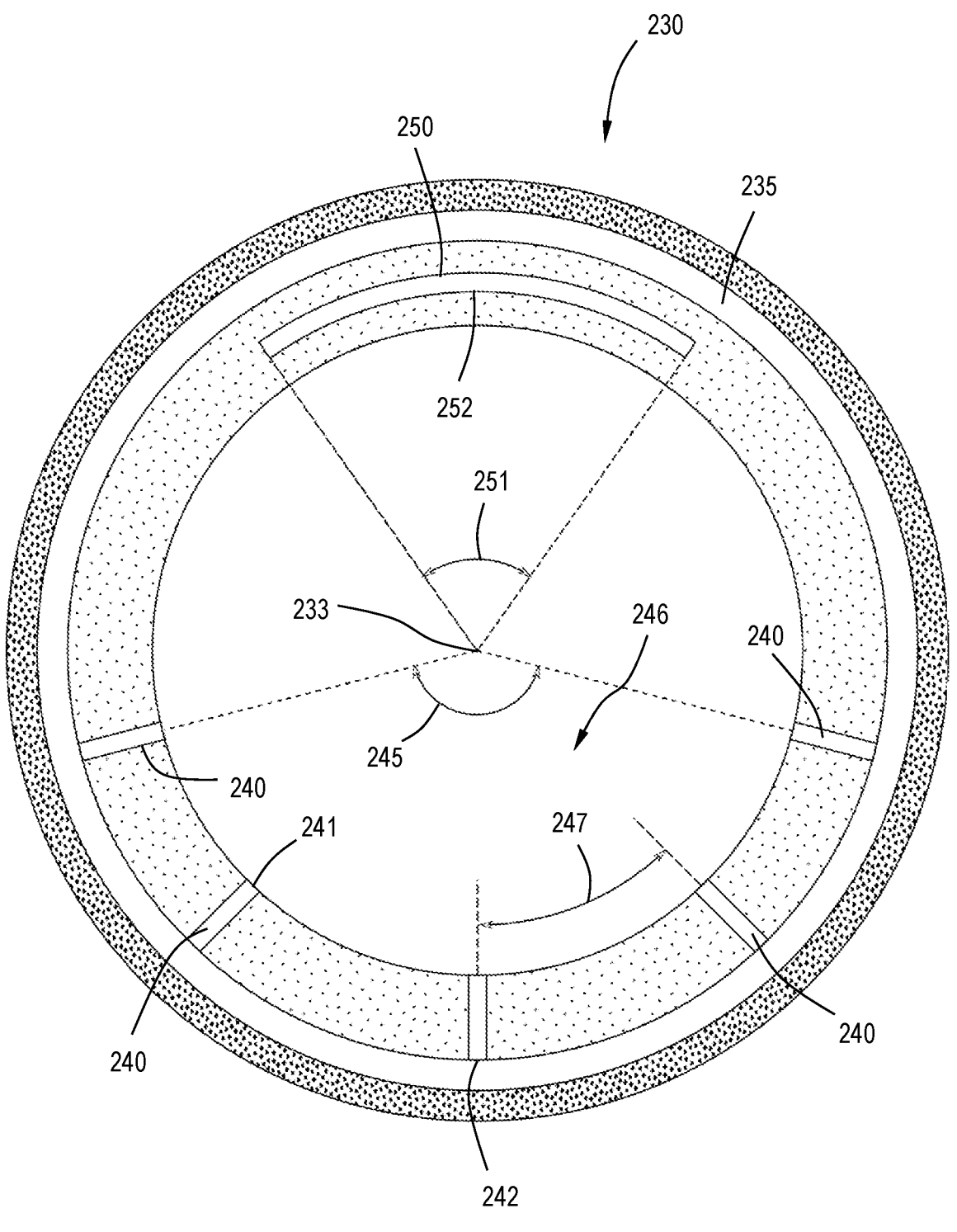
FIG. 5 shows a schematic view of a backing plate showing internal channels and features according to one or more embodiments of the disclosure.

FIG. 3 shows a cross-sectional view of a portion of a gas distribution apparatus 200 according to one or more embodiment of the disclosure. FIG. 4 shows a cross-sectional view of a portion of a backing plate 230 according to one or more embodiments of the disclosure. FIG. 5 shows a schematic view of a backing plate 230 showing internal channels and features for descriptive purposes.

Referring to FIGS. 3 through 5, the gas distribution apparatus 200 includes a blacking plate 230. The backing plate 230 has a front surface 231 and a back surface 232 that define the thickness of the backing plate 230. The thickness of the backing plate 230 can vary across the full span of the component.

A peripheral channel 235 is formed in the back surface 232 of the backing plate 230. The peripheral channel 235 has a depth $D_{PC}$ from the back surface 232 of the backing plate 230 to a bottom surface 236 of the peripheral channel 235. The depth $D_{PC}$ of the peripheral channel 235 in some embodiments is in the range of 5 mm to 15 mm, or in the range of 6 mm to 12 mm, or in the range of 7 mm to 9.5 mm. In some embodiments, the depth $D_{PC}$ of the peripheral channel 235 is less than or equal to 50%, 40%, 30%, 20% or 10% of the total thickness of the backing plate 230 at the radius of the peripheral channel 235. The skilled artisan will recognize that gas is provided to the peripheral channel 235 by any suitable gas distribution system. For example, a gas plate (not shown) can be positioned to enclose the peripheral channel 235 and one or more gas lines can connected to the gas plate to provide a gas flow into the peripheral channel.

A plurality of inwardly angled inlet channels 240 extend from the peripheral channel 235 to the front surface 231 of the backing plate 230 at an inlet angle Θ. The inwardly angled inlet channels 240 have an opening 241 in the front surface 231 of the backing plate 230 and an opening 242 in the peripheral channel 235. The opening 241 in the front surface 231 of the backing plate 230 is closer to a central axis 233 of the backing plate 230 relative to the opening 242 of the plurality of inwardly angled inlet channels 240 in the peripheral channel 235. The inlet angle Θ of the plurality of inwardly angled inlet channels 240 is in the range of 15° to 40° from to the front surface 231 of the backing plate 230.

Referring to FIG. 5, the plurality of inwardly angled inlet channels 240 are located in an inlet semicircle 245 of the backing plate 230 and are spaced to form an inlet zone 246 comprising the minor arc of the inlet semicircle 245. As used in this manner, the term "minor arc" refers to degrees of the inlet semicircle 245. In some embodiments, the inlet semicircle 245 forming the inlet zone 246 has a minor arc that is less than 160°.

The backing plate 230 has an outlet opening 250 in an outlet semicircle 251 of the backing plate 230. The outlet opening 250 has a width occupying in the range of 30° to 90° of the backing plate 230. The outlet opening 250 has a center 252 that is centered opposite a center of the minor arc of the inlet semicircle 245. Stated differently, the center of the total width of the inlet zone 246, in degrees, measured to the outermost edge of the plurality of inwardly angled inlet channels 240 is 180° relative to the central axis 233 of the backing plate 230 from the center 252 of the outlet opening 250, in degrees, from the edges of the outlet opening 250.

The number of plurality of inwardly angled inlet channels 240 in the inlet zone 246 can vary and impacts the overall cross-flow profile of the gas distribution apparatus 200. In the illustrated embodiments, there are five inwardly directed inlet channels 240. In some embodiments, there are at least three, four, five, six, seven, eight, or nine inwardly angled inlet channels 240. In some embodiments, there are in the range of 3 to 11 inwardly angled inlet channels 240, or in the range of 4 to 10 inwardly angled inlet channels 240, or in the range of 5 to 9 inwardly angled inlet channels 240.

The plurality of inwardly angled inlet channels 240 have outlet openings 241 in the front surface 231 of the backing plate 230. The outlet openings 241 of some embodiments are located equidistant from each other within the inlet semicircle 245. In some embodiments, the inlet openings 242 of the plurality of inwardly angled inlet channels 240, located within the peripheral channel 235, are located equidistant from each other within the inlet semicircle 245. In some embodiments, each of the plurality of inwardly angled inlet channels 240 have inlet openings 242 equidistant from each other and outlet openings 241 equidistant from each other.

The distance between adjacent inwardly angled inlet channels 240, within the inlet zone 246, depends on the total width of the inlet zone 246 and the number of inwardly angled inlet channels 240. In some embodiments, an inner arc 247 between two adjacent outlet openings is 10 degrees, 15 degrees, 20 degrees, 25 degrees, 30 degrees, 35 degrees, 40 degrees, 45 degrees, 50 degrees, 55 degrees or 60 degrees. As used in this manner, the term "inner arc" refers to the shortest distance, in degrees, between the center line of the stated components or openings. In some embodiments, the inner arc 247 between adjacent outlet openings is in the range of 20 degrees to 40 degrees, or in the range of 25 degrees to 35 degrees.

The diameter $D_{AC}$ of the inwardly angled inlet channels 240 of some embodiments remain substantially uniform along the length of the channel. As used in this manner, the term "substantially uniform" means that the diameter of the inwardly angled inlet channels 240 do not vary by more than 10% from the average diameter for a given channel. In some embodiments, the plurality of inwardly angled inlet channels 240 have a diameter in the range of 2 mm to 6 mm, or in the range of 3 mm to 4 mm, or in the range of 2.5 mm to 3.5 mm. In some embodiments, the plurality of inwardly angled inlet channels 240 connect to the peripheral channel 235 at a depth from the back surface 232 of the backing plate 230 so that the center of the diameter of the plurality of inwardly angled inlet channels is in the range of 3 mm to 5 mm from the back surface 232 of the backing plate 230.

The gas distribution apparatus 200 includes a faceplate 270. The faceplate 270 has a front surface 271 and a back surface 272 defining the thickness of the faceplate 270. The faceplate 270 is positioned so that there is a gap 275 between the front surface 231 of the backing plate 230 and the back surface 272 of the faceplate 270. The faceplate 270 has a plurality of apertures 277 extending through the thickness of the faceplate 270.

In some embodiments, the backing plate 230 further comprises an exhaust opening 238 extending through the thickness of the backing plate 230. The exhaust opening 238 of some embodiments is located outside an outer diameter of the peripheral channel 235 and outside an outer diameter 273 of the faceplate 270.

The gas distribution apparatus 200 of some embodiments further comprises a clamping ring 260. The clamping ring 260 has an upper portion 264 and a lower portion 266. The upper portion 264 has an outer diameter that is greater than an outer diameter of the lower portion 266. The upper portion 264 has an inner diameter with an inner face 265 sized to enclose the outer diameter 273 of the faceplate 270 and an upper support surface 267 configured to support an outer peripheral edge region of the faceplate 270.

The lower portion 266 of the clamping ring 260 has an inwardly directed extension 268 with a back surface 269 spaced from the upper support surface 267. The lower portion 266 has a plurality of spaced apertures (exhaust opening 262) between the back surface 269 of the inwardly directed extension 268 and the upper support surface 267.

The upper portion 264 of the clamping ring 260 of some embodiments further comprises an exhaust aperture 281 extending from the back surface 282 of the upper portion 264 of the clamping ring 260 to a front surface 283 of the upper portion 264 of the clamping ring 260. The exhaust aperture 281 of the clamping ring 260 of some embodiments is aligned with the exhaust opening 238 of the backing plate 230.

Some embodiments of the gas distribution apparatus 200 include a pumping ring 210 in contact with the back surface 232 of the backing plate 230. In some embodiments, the pumping ring 210 has an exhaust opening 212 aligned with the exhaust opening 238 of the backing plate 230. In some embodiments, the exhaust opening 281 of the clamping ring 260, the exhaust opening 238 of the backing plate 230 and the exhaust opening 212 of the pumping ring 210 are aligned to allow a flow of gas to pass through the exhaust opening 262 of the clamping ring 260, the exhaust aperture 281 of the clamping ring 260, the exhaust opening 238 of the backing plate 230 and the exhaust opening 212 of the pumping ring 210 to be exhausted from the processing chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A gas distribution apparatus comprising:
a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone comprising a minor arc of the inlet semicircle less than 160°, the backing plate having an outlet opening on an outlet semicircle of the backing plate, the outlet opening in a range of 30° to 90° of the minor arc and centered opposite a center of the minor arc of the inlet semicircle; and
a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate.

2. The gas distribution apparatus of claim 1, further comprising a clamping ring having an upper portion and a lower portion, the upper portion having an outer diameter greater than an outer diameter of the lower portion, the upper portion having an inner diameter sized to enclose the faceplate, the lower portion having an upper support surface configured to support the faceplate, the lower portion having an inwardly directed extension having a back surface spaced from the upper support surface, the lower portion having a plurality of spaced apertures between the back surface of the inwardly directed extension and the upper support surface.

3. The gas distribution apparatus of claim 2, wherein the backing plate further comprises an exhaust opening extending through the thickness of the backing plate outside an outer diameter of the peripheral channel and outside an outer diameter of the faceplate.

4. The gas distribution apparatus of claim 3, wherein the upper portion of the clamping ring further comprises an exhaust aperture extending from the back surface of the upper portion to a front surface of the upper portion, the exhaust aperture of the clamping ring aligned with the exhaust opening of the backing plate.

5. The gas distribution apparatus of claim 4, further comprising a pumping ring in contact with the back surface of the backing plate, the pumping ring having an exhaust opening aligned with the exhaust opening of the backing plate.

6. The gas distribution apparatus of claim 1, wherein there are at least five inwardly angled inlet channels.

7. The gas distribution apparatus of claim 1, wherein the plurality of inwardly angled inlet channels have outlet openings in the front surface of the backing plate, the outlet openings located equidistant from each other.

8. The gas distribution apparatus of claim 6, wherein there are five inwardly angled inlet channels.

9. The gas distribution apparatus of claim 8, wherein an inner arc between two adjacent outlet openings is 30 degrees.

10. The gas distribution apparatus of claim 1, wherein the peripheral channel has a depth in a range of 5 mm to 15 mm.

11. The gas distribution apparatus of claim 10, wherein the peripheral channel has a depth in a range of 7 mm to 9.5 mm.

12. The gas distribution apparatus of claim 1, wherein the plurality of inwardly angled inlet channels have a diameter in a range of 2 mm to 4 mm.

13. The gas distribution apparatus of claim 1, wherein the plurality of inwardly angled inlet channels connect to the peripheral channel at a depth where a center of a diameter of the plurality of inwardly angled inlet channels is in a range of 3 mm to 5 mm from the back surface of the backing plate.

14. The gas distribution apparatus of claim 1, wherein the plurality of inwardly angled inlet channels have an angle in a range of 15° to 40° from to the front surface of the backing plate.

15. A gas distribution apparatus comprising:

a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone comprising a minor arc of the inlet semicircle less than 160°, the backing plate having an outlet opening on an outlet semicircle of the backing plate, the outlet opening in a range of 30° to 90° of the minor arc and centered opposite a center of the minor arc of the inlet semicircle;

a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate; and a clamping ring having an upper portion and a lower portion, the upper portion having an outer diameter greater than an outer diameter of the lower portion, the upper portion having an inner diameter sized to enclose the faceplate, the lower portion having an upper support surface configured to support the faceplate, the lower portion having an inwardly directed extension having a back surface spaced from the upper support surface, the lower portion having a plurality of spaced apertures between the back surface of the inwardly directed extension and the upper support surface.

16. The gas distribution apparatus of claim 15, wherein the backing plate further comprises an exhaust opening extending through the thickness of the backing plate outside an outer diameter of the peripheral channel and outside an outer diameter of the faceplate.

17. The gas distribution apparatus of claim 16, wherein the upper portion of the clamping ring further comprises an exhaust aperture extending from the back surface of the upper portion to a front surface of the upper portion, the exhaust aperture of the clamping ring aligned with the exhaust opening of the backing plate.

18. The gas distribution apparatus of claim 15, wherein the peripheral channel has a depth in a range of 5 mm to 15 mm.

19. The gas distribution apparatus of claim 15, wherein there are at least five inwardly angled inlet channels.

20. A gas distribution apparatus comprising:

a backing plate having a front surface and a back surface defining a thickness of the backing plate, a peripheral channel formed in the back surface of the backing plate, the peripheral channel having a depth from the back surface of the backing plate to a bottom surface of the peripheral channel, a plurality of inwardly angled inlet channels extending from the peripheral channel to the front surface of the backing plate at an inlet angle, the plurality of inwardly angled inlet channels located in an inlet semicircle of the backing plate and spaced to form an inlet zone comprising a minor arc of the inlet semicircle less than 160°, the backing plate having an outlet opening on an outlet semicircle of the backing plate, the outlet opening in a range of 30° to 90° of the minor arc and centered opposite a center of the minor arc of the inlet semicircle;

a faceplate having a front surface and a back surface defining a thickness of the faceplate, the faceplate positioned adjacent to the backing plate so that there is a gap between the front surface of the backing plate and the back surface of the faceplate, the faceplate having a plurality of apertures extending through the thickness of the faceplate;

a clamping ring having an upper portion and a lower portion, the upper portion having an outer diameter greater than an outer diameter of the lower portion, the upper portion having an inner diameter sized to enclose the faceplate, the lower portion having an upper support surface configured to support the faceplate, the lower portion having an inwardly directed extension having a back surface spaced from the upper support surface, the lower portion having a plurality of spaced apertures between the back surface of the inwardly directed extension and the upper support surface; and a pumping ring in contact with the back surface of the backing plate, the pumping ring having an exhaust opening aligned with the exhaust opening of the backing plate, wherein the backing plate further comprises an exhaust opening extending through the thickness of the backing plate outside an outer diameter of the peripheral channel and outside an outer diameter of the faceplate, wherein the upper portion of the clamping ring further comprises an exhaust aperture extending from the back surface of the upper portion to a front surface of the upper portion, the exhaust aperture of the clamping ring aligned with the exhaust opening of the backing plate, wherein the inwardly angled inlet channels have outlet openings in the front surface of the backing plate, the outlet openings located equidistant from each other, wherein there are at least five inwardly angled inlet channels, wherein the peripheral channel has a depth in a range of 5 mm to 15 mm.

\* \* \* \* \*